United States Patent

Froidevaux et al.

(10) Patent No.: US 11,680,835 B2
(45) Date of Patent: Jun. 20, 2023

(54) CONDITIONING INTEGRATED CIRCUIT FOR AN INDUCTIVE-CAPACITIVE FLOW METER

(71) Applicant: STMicroelectronics (Rousset) SAS, Rousset (FR)

(72) Inventors: Nicolas Froidevaux, Aix en Provence (FR); Laurent Lopez, Peynier (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 233 days.

(21) Appl. No.: 17/155,880

(22) Filed: Jan. 22, 2021

(65) Prior Publication Data
US 2021/0231478 A1    Jul. 29, 2021

(30) Foreign Application Priority Data
Jan. 24, 2020  (FR) .................................. 2000712

(51) Int. Cl.
*G01F 1/60* (2006.01)
*H03K 5/01* (2006.01)

(52) U.S. Cl.
CPC ........ *G01F 1/60* (2013.01); *H03K 5/01* (2013.01)

(58) Field of Classification Search
None
See application file for complete search history.

(56) References Cited

U.S. PATENT DOCUMENTS

| 2,551,529 | A  |   | 5/1951 | Davis et al. |
| 3,133,205 | A  |   | 5/1964 | Zrubek |
| 6,420,873 | B1 |   | 7/2002 | Guthrie |
| 8,395,485 | B2 | * | 3/2013 | Wuidart ............. G06K 7/10158 340/572.5 |

OTHER PUBLICATIONS

AN4636 Demonstration of LC Sensor for Gas or Water Metering; STMicroelectronics, 2017.
NPI Search Report and Written Opinion for FR Appl. No. 2000712 dated Sep. 28, 2020 (9 pages).

* cited by examiner

*Primary Examiner* — Harshad R Patel
(74) *Attorney, Agent, or Firm* — Crowe & Dunlevy

(57) ABSTRACT

An oscillating analog signal includes a succession of dampened oscillations. That oscillating analog signal is conditioned to generate an output signal including only oscillations of the oscillating analog signal which have an amplitude smaller than a first threshold. The output signal is then processed by a processing unit, where the first threshold is compatible with a maximum level of voltage tolerable by the processing unit.

21 Claims, 3 Drawing Sheets

CONDITIONING INTEGRATED CIRCUIT FOR AN INDUCTIVE-CAPACITIVE FLOW METER

PRIORITY CLAIM

This application claims the priority benefit of French Application for Patent No. 2000712, filed on Jan. 24, 2020, the content of which is hereby incorporated by reference in its entirety to the maximum extent allowable by law.

TECHNICAL FIELD

Embodiments relate to integrated circuits and, in particular, to circuit configured for conditioning an oscillating analog signal comprising a succession of dampened oscillations.

BACKGROUND

Integrated circuits are known in the art which include processing units configured to process oscillating analog signals comprising a succession of oscillations having an amplitude decreasing over time.

For example, flowmeters comprise a processing unit configured to determine a flow rate of fluid on the basis of oscillating analog signals generated by inductive-capacitive sensors, also designated by the term "LC sensors", used in combination with a wheel placed in a flow of fluid and having at least one conductive portion.

The LC sensors comprise, in particular, a capacitor and an inductor that are connected in parallel, and further which are connected to input/output cells connected to the processing unit.

These LC sensors generate oscillating analog signals comprising a succession of dampened oscillations (i.e., defined herein as a signal where an amplitude of successive individual oscillations progressively decreases over a time period). These oscillating analog signals are transmitted to the processing unit via the input/output cells of the integrated circuit. The processing unit is thus configured to determine a flow rate of the fluid on the basis of the oscillating analog signals generated by the LC sensors.

Nevertheless, these oscillating analog signals can have the disadvantage of comprising first oscillations having strong amplitudes that can cause a fault in the electronic components of the processing unit.

In order to overcome this disadvantage, known solutions involve limiting the voltage powering the LC sensor to compensate for the overvoltage resulting from the first oscillations. This limitation imposes an additional constraint in the design of the flowmeter and limits the flexibility of having alternative functionalities for the input/output cells with different ranges of supplied power.

Another solution involves using diodes for protection against electrostatic discharges ("electrostatic discharge diodes", better known by the acronym "ESD diodes"). Such a solution is nevertheless costly.

There is therefore a need for a solution allowing to reduce or even eliminate the risk of fault in the electronic components of the processing unit, coming from oscillating analog signals comprising first oscillations having a strong amplitude.

More particularly, there is a need for a solution that does not have the disadvantages of the aforementioned known solutions.

SUMMARY

According to one aspect, an integrated circuit is proposed for conditioning an oscillating analog signal comprising a succession of dampened oscillations, the integrated circuit comprising an input/output cell including: a first port configured to receive said oscillating analog signal (referred to as the input signal; a second port configured to deliver an output analog signal on the basis of the input signal; a control circuit coupled between the first port and the second port and configured to eliminate from the input signal at least the first oscillation in such a way as to deliver in the output signal oscillations of the input signal having an amplitude smaller than a first threshold (for example, 5V).

The output of the integrated circuit can, in particular, be connected to a processing unit in such a way as to be able to transmit to the processing unit the oscillating analog signal delivered by the second port.

The first threshold is thus advantageously compatible with correct operation of the processing unit connected to the second port, that is to say compatible with a maximum level of voltage tolerable by the processing unit.

Such an integrated circuit allows to not transmit the oscillations having an amplitude, typically a peak-to-peak voltage level, greater than said threshold to the processing unit. These oscillations could indeed cause a fault in the processing unit if they were transmitted to the processing unit. Thus, such an integrated circuit allows to reduce or even eliminate the risk of a fault in the processing unit.

Preferably, the integrated circuit further comprises said processing unit connected to the second port, the first threshold being compatible with a maximum level of voltage tolerable by the processing unit.

Advantageously, the integrated circuit further comprises a main controlling circuit. Moreover, the control circuit includes a switch connected between the first port and the second port, the switch being controllable by the main controlling circuit. The control circuit further comprises an auxiliary controlling circuit configured to temporarily take control of the switch instead of the main controlling circuit in such a way as to allow said elimination of said at least the first oscillation of the input signal.

The switch allows for communication of the input signal to the processing unit. The main controlling circuit is configured to usually control the switch by a control signal. Nevertheless, the auxiliary controlling circuit is configured to take control of the switch temporarily in such a way as to eliminate said at least the first oscillation of the input signal, regardless of the control signal of the main controlling circuit.

The input/output cell IO comprising the control circuit can thus be designed on the basis of a conventional input/output cell in which the auxiliary controlling circuit is added.

Preferably, the switch is configured to operate in the presence of one or more oscillations of the input signal having an amplitude greater than or equal to said first threshold, and having a first terminal connected to the first port and a second terminal connected to the second port, the switch being able to be ordered: either into a closed state electrically connecting the first port to the second port, or into an open state disconnecting the first port from the second port.

Moreover, the auxiliary controlling circuit is configured to: maintain the switch in an open state during the first oscillation of the input signal and optionally one or more oscillations directly following the first oscillation, then allow a switching of the switch to a closed state.

In particular, the auxiliary controlling circuit forces the switch into an open state during the first oscillation(s) of the input signal. The auxiliary controlling circuit thus allows for preventing the transmission of these oscillations to the second port of the integrated circuit. Moreover, the auxiliary controlling circuit, by allowing a switching of the switch to a closed state after said at least one oscillation, allows for transmitting the following oscillations of the input analog signal to the second port of the integrated circuit.

Thus, the auxiliary controlling circuit allows for eliminating from the input signal the first oscillation(s) in such a way as to deliver in the output signal oscillations of the input signal having an amplitude smaller than a threshold.

In an advantageous embodiment, the input/output cell further comprises a converter circuit that is configured to convert the oscillating analog signal into a square signal and to deliver this square signal to said auxiliary controlling circuit.

In an advantageous embodiment, the converter circuit comprises a Schmitt trigger.

In an advantageous embodiment, the auxiliary controlling circuit comprises a counter circuit configured to count a defined number of edges of the square signal starting from a first edge of the square signal, the auxiliary controlling circuit being configured to allow a switching of the switch to a closed state when the count made by the counter circuit reaches the defined number of rising edges by the main controlling circuit.

Thus, the counter circuit allows for counting the number of oscillations that should not be transmitted at the output of the input/output cell.

Alternatively, it is possible to provide a delay circuit instead of a counter circuit to determine the moment to switch the switch to a closed state to transmit the oscillations to the second port of the input/output cell.

In an advantageous embodiment, the integrated circuit further comprises said processing unit connected to the second port of the integrated circuit and configured to count the number of oscillations of the output signal having an amplitude greater than a second threshold lower than the first threshold.

According to another aspect, a system is proposed comprising: an inductive-capacitive sensor; and an integrated circuit as described above, the first port of which is connected to the inductive-capacitive sensor; wherein the inductive-capacitive sensor is configured to deliver said oscillating analog signal after an excitation phase triggered by the integrated circuit.

According to another aspect, a flowmeter is proposed comprising a system as described above.

According to another aspect, a method is proposed for conditioning an oscillating analog signal comprising a succession of dampened oscillations, in which method at least the first oscillation of the oscillating analog signal is eliminated and the other oscillations of the oscillating analog signal having an amplitude smaller than a first threshold are delivered in an output analog signal.

BRIEF DESCRIPTION OF THE DRAWINGS

Other advantages and features of the invention will appear upon examining the detailed description of embodiments, in no way limiting, and the appended drawings in which.

DETAILED DESCRIPTION

Figure 1:
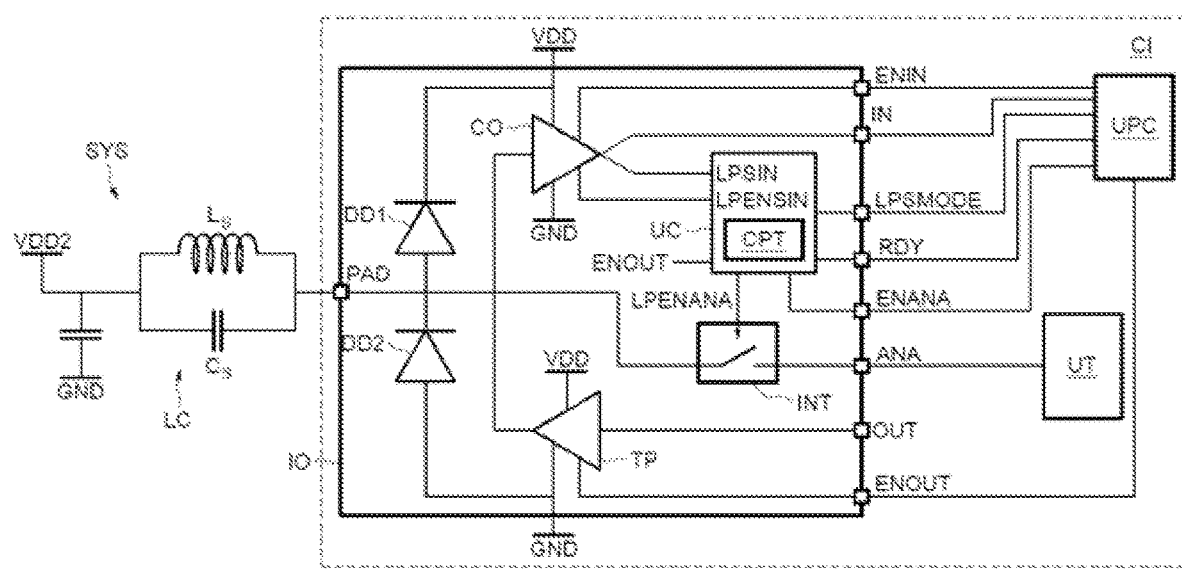
FIG. 1 shows a system.

FIG. 1 shows a system SYS according to an embodiment. The system SYS comprises an inductive-capacitive sensor LC, and an integrated circuit CI including a input/output cell IO, a main controlling circuit UPC and a processing unit UT.

The processing unit UT is configured to tolerate a maximum voltage threshold. For example, the processing unit UT is configured to process signals having a maximum voltage amplitude of 5V.

The sensor LC comprises an inductor Ls and a capacitor Cs mounted in parallel.

The input/output cell IO comprises a first port PAD to which the sensor LC is connected.

The input/output cell IO comprises a first protective diode DD1 having an input (anode) connected to the first port PAD and an output (cathode) connected to a power supply terminal intended to receive a power supply voltage VDD. The input/output cell IO also comprises a second protective diode DD2 having an input (anode) connected to the ground GND and an output (cathode) connected to the first port PAD.

The input/output cell further comprises a second port ANA to which the processing unit UT is connected.

The input/output cell IO, which is a bidirectional cell, also comprises an input ENIN, an output IN (although it is an output, the latter is designated by the reference IN given its placement with respect to the main controlling circuit UPC), an output RDY, an input LPSMODE, an input ENANA, an input ENOUT and an input OUT (although it is an input, the latter is designated by the reference OUT given its placement with respect to the main controlling circuit UPC).

The input/output cell IO further comprises a switch INT having a first terminal connected to the first port PAD and a second terminal connected to the second port ANA.

The switch INT can be ordered (i.e., controlled) into a closed state which electrically connects the first port PAD to the second port ANA. The switch INT can also be ordered into an open state that disconnects the first port PAD from the second port ANA. In particular, the signal delivered by the main controlling circuit UPC to the input ENANA allows to control the closed/open state of the switch INT.

The switch INT can, for example, be a transistor or a thyristor. In particular, the switch INT is configured to tolerate a signal having an amplitude greater than the maximum threshold of voltage tolerated by the processing unit. For example, the switch INT can tolerate voltages greater than 5V.

The input/output cell IO also comprises a converter circuit CO, a buffer circuit TP and an auxiliary controlling circuit UC configured to control the switch INT.

The converter circuit CO has an input electrically connected to the first port PAD and an output connected to an input LPSIN of the auxiliary controlling circuit UC. This converter circuit CO is powered by the voltage VDD. The converter circuit CO also has a port connected to the ground. The converter circuit CO is adapted to generate at the output a square wave signal on the basis of an oscillating analog signal at the input. Preferably, the converter circuit CO is a Schmitt trigger.

The main controlling circuit UPC is configured to deliver a signal at the input ENIN allowing to activate or deactivate the converter circuit CO.

The square signal at the output of the converter circuit CO can be transmitted to the output IN in such a way as to be able to be processed by the main controlling circuit UPC. The converter circuit CO has two functions. A first conventional function involves shaping a distorted (or noisy) square signal coming from outside the integrated circuit; the shaped signal is then transmitted to the output IN of the input/output cell. A second function involves transforming an oscillating signal provided by the sensor LC into a square signal. This second function will be described in detail below.

The signal delivered to the input LPSMODE allows to activate the auxiliary controlling circuit UC.

The auxiliary controlling circuit UC comprises a counter circuit CPT adapted to count a number of rising edges of the square signal delivered by the converter circuit CO to the input LPSIN of the auxiliary controlling circuit UC.

The auxiliary controlling circuit UC is configured to receive the signal delivered by the main controlling circuit UPC to the input ENANA of the input/output cell.

More particularly, the auxiliary controlling circuit UC is configured to allow the control of the switch INT by the signal ENANA or to maintain the switch INT in an open state by delivering a control signal LPENANA.

In particular, the auxiliary controlling circuit UC is configured to deliver a control signal LPENANA when count made by the counter circuit CPT has not yet reached a predetermined number n.

The auxiliary controlling circuit UC further comprises an input configured to receive a signal received by the input ENOUT. This signal can be emitted by the main controlling circuit UPC to activate or deactivate the buffer circuit TP.

The auxiliary controlling circuit UC also comprises an output connected to the output RDY of the input/output cell IO. The auxiliary controlling circuit UC is thus configured to emit a signal to the main controlling circuit UPC when the counter has reached the predetermined number n. The auxiliary controlling circuit UC thus indicates that the main controlling circuit UPC can control the switch by the signal LPENANA.

The buffer circuit TP has an input configured to receive a signal delivered to the input OUT of the input/output cell IO by the main controlling circuit UPC, an output configured to deliver a signal to the first port PAD of the input/output cell IO.

The buffer circuit TP also comprises an input configured to receive the signal delivered by the main controlling circuit by the input ENOUT of the input/output cell IO. This signal allows to activate or to deactivate the buffer circuit.

The buffer circuit TP is powered by the voltage VDD. The buffer circuit TP also has a port connected to the ground GND.

The buffer circuit TP is configured to allow the triggering of a phase of excitation of the sensor LC. During the excitation phase, the first port PAD is brought to 0 volts by setting the signal ENOUT to 0 to activate the buffer circuit TP and by setting the input OUT to 0.

At the end of the excitation phase, the signal ENOUT is set to 1 to deactivate the buffer circuit TP. The first port PAD is thus not brought to 0 or to 1 by the buffer circuit TP. The sensor LC thus delivers an analog signal comprising a succession of dampened oscillations.

Figure 2:
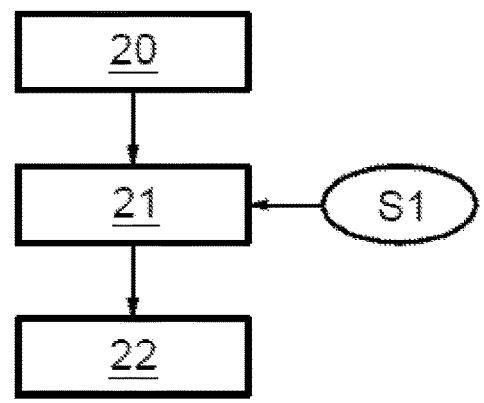
FIG. 2 shows steps of a conditioning method.

FIG. 2 shows an embodiment of a conditioning method.

In step 20, the oscillating electrical signal delivered by the sensor LC is transmitted to the first port PAD of the input/output cell IO.

This oscillating electrical signal, referred to herein as an input signal, then arrives at the input of the converter circuit CO. The converter circuit CO converts the oscillating input signal into a square signal. This square signal is then transmitted to the input LPSIN of the auxiliary controlling circuit UC.

In step 21, at least the first oscillation of the input signal is eliminated in such a way as to deliver in the output signal the other oscillations of the input signal.

In particular, the counter circuit CPT of the auxiliary controlling circuit UC counts the rising edges of the square signal, which are representative of the oscillations of the input signal, until it reaches a predefined number n. During these n oscillations, the auxiliary controlling circuit UC delivers a signal LPENANA allowing to maintain the switch INT in an open state to prevent the transmission of these n oscillations to the processing unit UT. When count of the counter circuit CPT reaches this predefined number n, the auxiliary controlling circuit UC delivers a signal RDY to the main controlling circuit in such a way as to allow the control of the switch INT by the signal delivered by the main controlling circuit UPC to the input ENANA. The signal delivered to the input ENANA can thus order the switch INT into a closed state. The following oscillations of the oscillating analog signal delivered by the sensor LC are thus transmitted to the processing unit UT in step 22.

In particular, the number n of oscillations is defined according to the maximum voltage threshold S1 that can be tolerated by the processing unit UT.

Thus, the auxiliary controlling circuit UC allows, by ordering the switch INT into an open state during the n first oscillations, to be able to transmit to the processing unit UT only the oscillations of the input signal having an amplitude smaller than the threshold S1.

In particular, these n oscillations could have an amplitude that could cause a fault in the electronic components of the processing unit UT if these n oscillations were transmitted to the processing unit UT. For example, these n oscillations can have an amplitude greater than 5V whereas the processing unit UT has a maximum voltage threshold of 5V.

By preventing the transmission of these n oscillations to the processing unit UT, the auxiliary controlling circuit UC allows to protect the processing unit UT against the oscillations having an amplitude that can cause a fault in the processing unit UT.

In particular, the auxiliary controlling circuit UC can, for example, be configured to eliminate only the first oscillation, or the first two oscillations or the first three oscillations of the input signal. In other words n can be equal to 1, 2 or 3, for example.

The input/output cell IO can be manufactured from a conventional input/output cell in which the auxiliary controlling circuit UC as well as the input LPSMODE and the output RDY are added.

Figure 3:
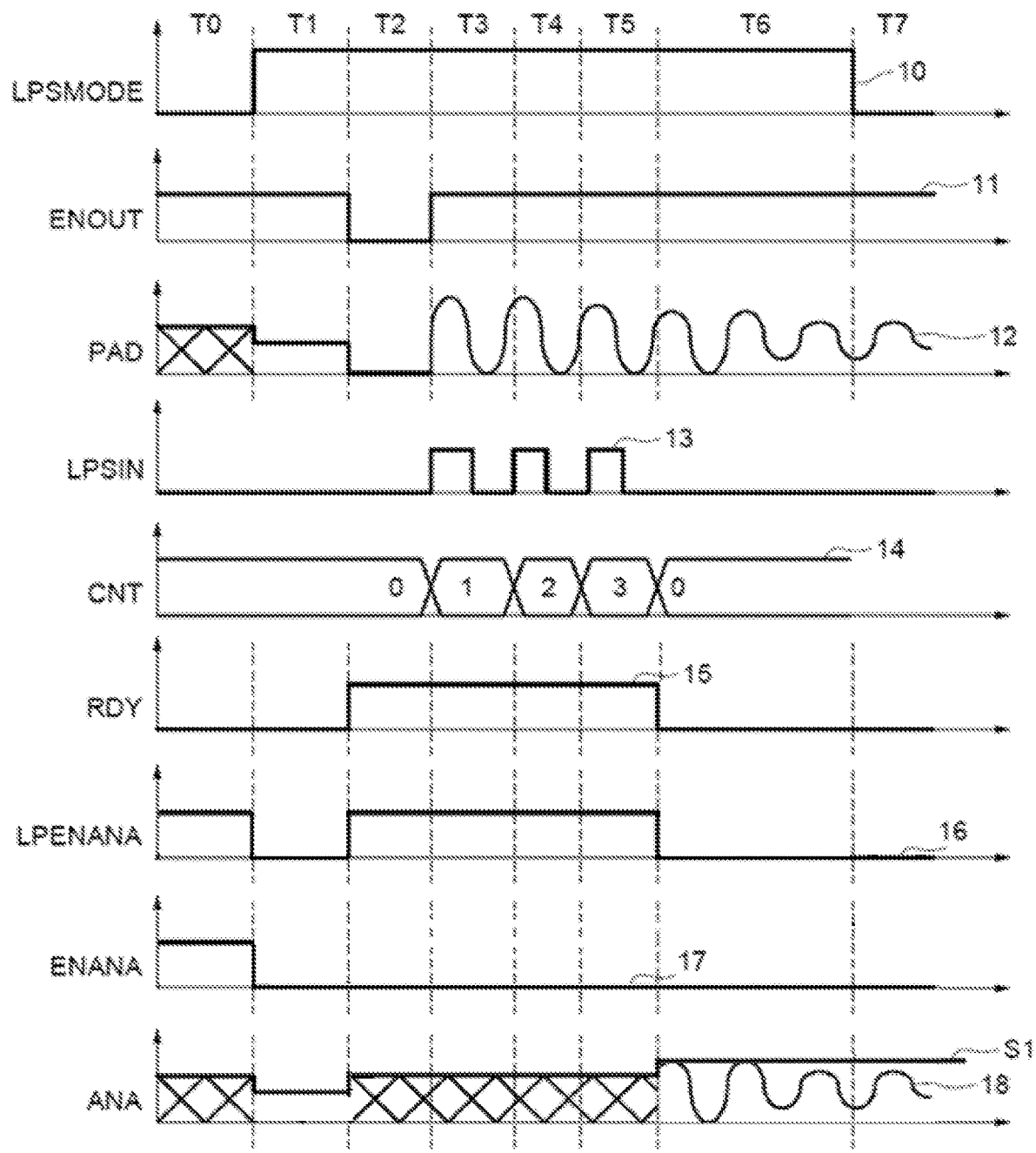
FIG. 3 illustrates a timing diagram.

FIG. 3 illustrates a timing diagram representing an embodiment of a method according to an embodiment of the invention.

The curve 10 represents the signal delivered to the input LPSMODE.

The curve 11 represents the signal delivered to the input ENOUT.

The curve 12 represents the signal delivered by the sensor LC on the first PAD.

The curve 13 represents the signal delivered to the input LPSIN of the auxiliary controlling circuit UC.

The curve 14 represents the value of the counter circuit CPT of the auxiliary controlling circuit UC.

The curve 15 represents the signal delivered to the input RDY.

The curve 16 represents the signal LPENANA delivered by the auxiliary controlling circuit UC.

The curve 17 represents the signal delivered to the input ENANA.

The curve 18 represents the signal delivered by the output ANA.

In this embodiment of the method, the auxiliary controlling circuit UC is configured to allow a switching of the switch INT into a closed state after three oscillations of the oscillating analog signal delivered by the sensor LC (n is thus predefined as 3).

Moreover, in this embodiment, the signals delivered to the inputs ENIN, ENANA and ENOUT as well as the signal LPENANA are control signals active in the low state, here at 0.

In step T0, the signal delivered to the input LPSMODE is at 0. The auxiliary controlling circuit UC is thus deactivated. The signal ENOUT, the signal LPENANA and the signal ENANA are at 1 so that the auxiliary controlling circuit UC is deactivated and the switch INT is in an open state. The signal RDY is at 0. The sensor LC does not deliver any signal. Moreover, the signal ENIN (not shown) is at 0 in such a way as to activate the converter circuit CO.

In step T1, the signal delivered to the input LPSMODE is set to 1. The auxiliary controlling circuit UC is activated. The voltage at the first port PAD of the input/output cell IO is brought to Vmid where Vmid=VDD/2. In particular, the voltage Vmid is imposed by a circuit not shown in FIG. 1.

In step T2, the signal delivered to the input ENOUT is set to 0 to activate the buffer circuit TP. The output signal OUT (not shown) is at 0. The voltage at the first port PAD of the input/output cell IO is brought to 0V. This phase corresponds to the phase of excitation of the sensor LC. The auxiliary controlling circuit UC sets the signal LPENANA to 1 in such a way as to force the switch into an open state. The switch INT can no longer be controlled by the signal ENANA. The signal delivered at the input RDY goes to 1 to indicate to the main controlling circuit UPC that the switch is open and that it is not controllable by the signal ENANA.

In step T3, the signal ENOUT is set to 1 marking the end of the excitation phase. The sensor LC thus delivers the input oscillating analog signal on the first port PAD, the analog signal comprising a succession of dampened oscillations. A first oscillation is converted into a square signal LPSIN by the converted CO. The counter circuit CPT counts a first rising edge on the signal LPSIN. The switch INT is forced into an open state by the signal LPENANA which is maintained at 1; the signal ENANA is ignored. Thus, this first oscillation is not transmitted to the output ANA of the input/output cell.

In step T4, a second rising edge on the signal LPSIN is counted by the counter circuit CPT. The switch INT is maintained in an open state by the signal LPENANA which is at 1. The second oscillation is not transmitted to the output ANA of the input/output cell.

In step T5, a third rising edge on the signal LPSIN is counted by the counter circuit CPT. The counter circuit CPT thus reaches the predefined number n of oscillations to not be transmitted to the processing unit UT. It is thus ensured that the following oscillations will have an amplitude smaller than the threshold S1. The switch INT is maintained in an open state by the signal LPENANA. The third oscillation is not transmitted to the output ANA of the input/output cell.

In step T6, the signal LPENANA goes to 0. The switch INT is thus no longer forced into an open state by the signal LPENANA and again becomes controllable by the signal delivered to the input ENANA. Since the signal delivered to the input ENANA is at 0, the switch switches into a closed state. The auxiliary controlling circuit sets to 0 the signal delivered to the output RDY to indicate to the main controlling circuit that the switch can be controlled by the signal ENANA.

Since the switch INT is in a closed state, the following oscillations of the input signal are transmitted to the processing unit UT. The counter circuit CPT is reset to 0. The signal RDY is set to 0.

In step T7, the signal LPSMODE is set to 0.

The system SYS described above can be used in a flowmeter. In particular, in such a flowmeter, the sensor LC is used in combination with a wheel having at least one conductive portion and at least one non-conductive portion. The wheel is placed in a flow of fluid in such a way as to be able to be rotated by the latter. As for the sensor LC, it is stationary. The sensor LC generates oscillating analog signals. These oscillating analog signals are more or less dampened according to the relative position of the sensor LC with respect to the conductive portion.

Figure 4:
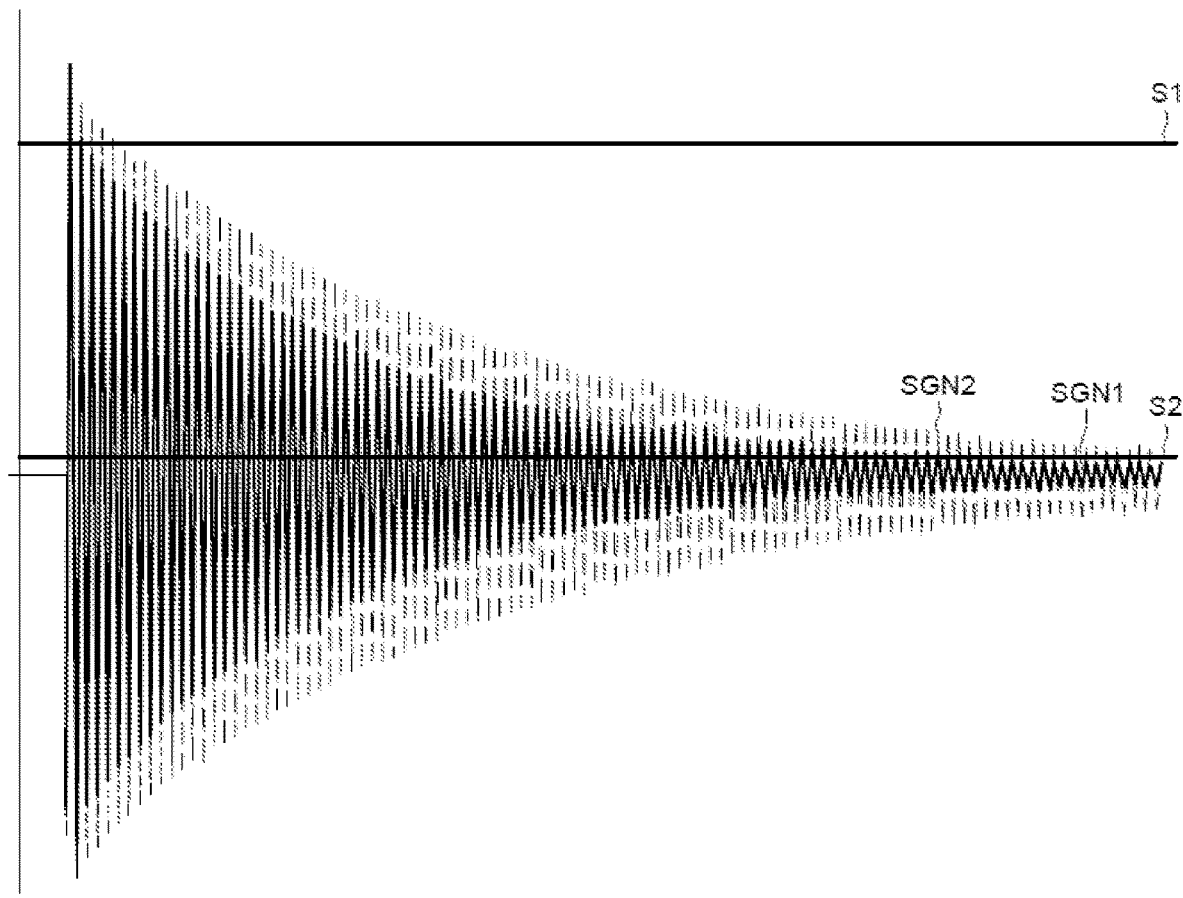
FIG. 4 shows two oscillating analog signals.

For illustrative purposes, FIG. 4 shows two oscillating analog signals SGN1, SGN2 that can be generated by the sensor LC. A first signal SGN1 is obtained when the sensor LC is close to a conductive portion of the wheel. The second signal SGN2 is obtained when the sensor LC is close to a non-conductive portion of the wheel. It can thus be observed that the first signal SGN1 is more dampened than the second signal SGN2.

The processing unit UT is configured to determine a flow rate of fluid on the basis of the speed of rotation of the wheel. The speed of rotation of the wheel is determined by analyzing the damping of the oscillating analog signals generated by the sensor LC.

In particular, the relative position of the wheel with respect to the sensor LC is determined by counting the number of oscillations of the output signal transmitted to the processing unit UT and which have an amplitude greater than a threshold S2. The determination of the relative position of the sensor LC with respect to the conductive portion of the wheel at various times allows to deduce the speed of rotation of the wheel and thus the flow rate of fluid.

The processing unit UT thus counts the oscillations of the signal generated by the sensor LC having an amplitude between the threshold S1 and the threshold S2, the oscillations having an amplitude greater than S1 having been eliminated by the input/output cell IO.

It should be noted that the elimination of the first oscillation(s) of the input signal only has a negligible effect on the determination of the flow rate of fluid. Indeed, there are generally about a hundred oscillations taken into account for the determination of the flow rate.

The general operation of such a flowmeter is well known to a person skilled in the art and is in particular described in the application note AN4636 entitled "Demonstration of LC sensor for gas or water metering based on STM32L073Z-EVAL and STM32L476RG-NUCLEO boards" published in September 2017 by the company STMicroelectronics (incorporated by reference).

Of course, the present invention is capable of various alternatives and modifications that will be clear to a person skilled in the art. For example, as an alternative to the counter circuit CPT of the auxiliary controlling circuit UC, it is possible to provide a delay circuit allowing to eliminate from the input signal at least the first oscillation in such a way as to deliver in the output signal oscillations of the input signal having an amplitude smaller than a threshold.

Moreover, it is advantageous to double said converter circuit CO. Two converters are thus used in parallel. By doubling the converter circuit CO, it is possible to increase the hysteresis in such a way as to immunize the signal delivered at the input of the auxiliary controlling circuit UC against the noise on the power supply of each converter circuit CO.

The invention claimed is:

1. An integrated circuit, comprising:
   a first port configured to receive an input oscillating analog signal, wherein the input oscillating analog signal comprises a succession of dampened oscillations;
   a second port configured to deliver an output analog signal on the basis of the input oscillating analog signal; and
   a circuit coupled between the first port and the second port and configured to eliminate, from the input oscillating analog signal, at least a first oscillation of the input oscillating analog signal and to deliver in the output signal oscillations of the succession of dampened oscillations which follow said at least a first oscillation that have an amplitude smaller than a first threshold.

2. The integrated circuit according to claim 1, further comprising a processing unit connected to the second port, wherein the first threshold is compatible with a maximum level of voltage tolerable by the processing unit.

3. The integrated circuit according claim 1, wherein the circuit comprises:
   a main switch controlling circuit;
   a switch connected between the first port and the second port and controllable in response to a signal generated by the main switch controlling circuit; and
   an auxiliary switch controlling circuit configured to temporarily take control of the switch from the main switch controlling circuit in order to allow said elimination of said at least the first oscillation of the input oscillating analog signal.

4. The integrated circuit according to claim 3:
   wherein the switch has a first terminal connected to the first port and a second terminal connected to the second port, the switch being able to be ordered: into a closed state for electrically connecting the first port to the second port and an open state for electrically disconnecting the first port from the second port; and
   wherein the auxiliary switch controlling circuit is configured to: maintain the switch in the open state during at least a first oscillation of the input oscillating analog signal and thereafter to allow a switching of the switch to the closed state in response to said signal generated by the main switch controlling circuit.

5. The integrated circuit according to claim 3, wherein the circuit further comprises a converter circuit configured to convert the input oscillating analog signal into a square wave signal and wherein said auxiliary switch controlling circuit processes the square wave signal to detect said at least the first oscillation of the input oscillating analog signal.

6. The integrated circuit according to claim 5, wherein the converter circuit comprises a Schmitt trigger.

7. The integrated circuit according to claim 5, wherein the auxiliary switch controlling circuit comprises a counter configured to count edges of the square signal, and wherein the auxiliary switch controlling circuit allows the switching of the switch to the closed state when a count of the counter circuit reaches a certain number of edges.

8. The integrated circuit according to claim 7, further comprising a processing unit connected to the second port, wherein the processing unit is configured to count a number of oscillations of the output signal having an amplitude greater than a second threshold, said second threshold being lower than the first threshold.

9. A system, comprising:
   an inductive-capacitive sensor configured to generate an oscillating analog signal, wherein the input oscillating analog signal comprises a succession of dampened oscillations;
   an integrated circuit, comprising:
   a first port configured to receive said oscillating analog signal;
   a second port configured to deliver an output analog signal on the basis of the oscillating analog signal; and
   a circuit coupled between the first port and the second port and configured to eliminate, from the input oscillating analog signal, at least a first oscillation of the input oscillating analog signal and to deliver in the output signal oscillations of the succession of dampened oscillations which follow said at least a first oscillation that have an amplitude smaller than a first threshold;
   wherein the inductive-capacitive sensor is further configured to deliver said oscillating analog signal to the input port after an excitation phase triggered by the integrated circuit.

10. The system according to claim 9, further comprising a processing unit connected to the second port, wherein the first threshold is compatible with a maximum level of voltage tolerable by the processing unit.

11. The system according claim 9, wherein the circuit comprises:
    a main switch controlling circuit;
    a switch connected between the first port and the second port and controllable in response to a signal generated by the main switch controlling circuit; and
    an auxiliary switch controlling circuit configured to temporarily take control of the switch from the main switch controlling circuit in order to allow said elimination of said at least the first oscillation of the input oscillating analog signal.

12. The system according to claim 11:
    wherein the switch has a first terminal connected to the first port and a second terminal connected to the second port, the switch being able to be ordered: into a closed state for electrically connecting the first port to the second port and an open state for electrically disconnecting the first port from the second port; and
    wherein the auxiliary switch controlling circuit is configured to: maintain the switch in the open state during at least a first oscillation of the input oscillating analog signal and thereafter to allow a switching of the switch to the closed state in response to said signal generated by the main switch controlling circuit.

13. The system according to claim 11, wherein the circuit further comprises a converter circuit configured to convert the input oscillating analog signal into a square wave signal and wherein said auxiliary switch controlling circuit processes the square wave signal to detect said at least the first oscillation of the input oscillating analog signal.

14. The system according to claim 13, wherein the converter circuit comprises a Schmitt trigger.

15. The system according to claim 13, wherein the auxiliary switch controlling circuit comprises a counter configured to count edges of the square signal, and wherein the auxiliary switch controlling circuit allows the switching of the switch to the closed state when a count of the counter circuit reaches a certain number of edges.

16. The system according to claim 15, further comprising a processing unit connected to the second port, wherein the processing unit is configured to count a number of oscillations of the output signal having an amplitude greater than a second threshold, said second threshold being lower than the first threshold.

17. A flowmeter comprising the system according to claim 9.

18. A method, comprising:
    receiving at an input port an input oscillating analog signal comprising a succession of dampened oscillations; and
    conditioning the input oscillating analog signal with a circuit to generate an output signal at an output port in which at least a first oscillation of the input oscillating analog signal is eliminated and other oscillations of the succession of dampened oscillations which follow said at least a first oscillation that were not eliminated have an amplitude smaller than a first threshold.

19. The method according to claim 18, further comprising processing the output signal by a processing unit, wherein the first threshold is compatible with a maximum level of voltage tolerable by the processing unit.

20. The method according to claim 19, further comprising counting by the processing unit of a number of oscillations of the output signal having an amplitude greater than a second threshold, said second threshold being lower than the first threshold.

21. The method according to claim 18, wherein conditioning comprises:
    converting the input oscillating analog signal to as square wave signal;
    counting edges of the square wave signal; and
    blocking passage of the input oscillating analog signal to generate the output signal until a count of the edges exceeds a certain number of edges.

* * * * *